United States Patent [19]

Botti

[11] Patent Number: 4,814,723
[45] Date of Patent: Mar. 21, 1989

[54] INTEGRATABLE CLASS AB OUTPUT STAGE FOR LOW-FREQUENCY AMPLIFIERS

[75] Inventor: Edoardo Botti, Mortara, Italy

[73] Assignee: SGS-Thomson Microelectronics S.p.A., Catania, Italy

[21] Appl. No.: 180,742

[22] Filed: Apr. 12, 1988

[30] Foreign Application Priority Data

Apr. 21, 1987 [IT] Italy ................................ 20196 A/87

[51] Int. Cl.$^4$ ............................................. H03F 3/26
[52] U.S. Cl. .................................... 330/263; 330/267; 330/268
[58] Field of Search ............... 330/118, 255, 263, 265, 330/267, 268, 270, 273, 274

[56] References Cited

U.S. PATENT DOCUMENTS 4,176,323  11/1979  Odell .................................... 330/263
4,471,323   9/1984  Trilling ................................ 330/268

Primary Examiner—Steven Mottola
Attorney, Agent, or Firm—Guido Modiano; Albert Josif

[57] ABSTRACT

To obtain a constant quiescent current, high dynamics and high stability of a class AB output stage of low-frequency amplifiers, comprising an input transistor; a driving circuit comprising a current source, a first pair of driving transistors connected in series between the current source and the input transistor, a second pair of driving transistors mutually connected in series and driven by the first pair of driving transistors; as well as a pair of output transistors driven by the second pair of driving transistors, the driving circuit comprises a first resistor connected between the current source and the base of one of the first pair of driving transistors, a second resistor connected between the bases of the transistors of the first pair and a resistive network inserted in series between the transistors of the second driving pair. The resistive network is constituted by two resistive branches connected in parallel, the intermediate point of the first resistive branch being connected to the ground voltage and the intermediate terminal of the other resistive branch being connected to the stage output.

10 Claims, 2 Drawing Sheets

INTEGRATABLE CLASS AB OUTPUT STAGE FOR LOW-FREQUENCY AMPLIFIERS

BACKGROUND OF THE INVENTION

The present invention relates to an integratable class AB output stage for low-frequency amplifiers.

In class AB audio amplifiers, the current circulating in the final power transistors in quiescent state is always approximately three orders of magnitude lower than the maximum deliverable current. This current must be sufficiently stable as the operating conditions vary, so as to not reduce to excessively low values, for which an increase of the cross-over distortion (distortion present at the passage through zero) occurs or so as to not increase to values which entail an excessive dissipation of power in quiescent state.

Another problem of these stages resides in keeping as low as possible the drop-out (difference between the supply voltage and the maximum peak-to-peak output voltage).

Furthermore said audio amplifiers must have good stability, and this may be troublesome if the output amplifier stage is constituted by a negatively fedback amplifier, not easily compensatable with integratable components.

Normally, in output stages of the indicated type, the bias or quiescent current is set by feeding the bases of the output power transistors with a constant current. Each output power transistor comprises a current mirror circuit formed by a transistor and by a diode, with the emitter area of the transistor forming the diode being dimensioned as to be 20 to 30 times smaller than the emitter area of the actual output transistor. A resistor is normally present in series to the diodes and increases the current gain of the current mirror as the output current increases.

A final stage of this type, with collector output of the output power transistor, is illustrated schematically in FIG. 1. In this figure, $Q_1$ indicates an input transistor, to which the signal is applied, $Q_2$–$Q_4$ are driving transistors, connected in pairs so as to define two current mirrors and form with the constant-current source $I_1$ the driving stage. $Q_7$ and $Q_9$ indicate a higher current mirror, while $Q_6$ and $Q_{10}$ represent a lower current mirror, with the transistors $Q_6$ and $Q_7$ being connected with their emitters respectively to the negative supply voltage and to the positive supply voltage and, with their collectors, to one another and to the output B of the stage. In series to the transistor $Q_{10}$ and $Q_9$, forming the diodes of the output mirrors, resistors $R_9$ and $R_{10}$ are provided to increase the output gain in the case of high currents.

In this known circuit, considering the emitter area of the diode-connected transistors $Q_2$ and $Q_3$ equal to that of the actual driving transistors $Q_4$ and $Q_5$, and considering the emitter area of the diodes $Q_{10}$ and $Q_9$ equal to 1/20 of the area of the respective output transistors $Q_6$ and $Q_7$ (ignoring the base currents, the imprecisions of the current mirror circuits due to the Early voltage of the transistors and the voltage drops on the resistors $R_9$ and $R_{10}$) the output current of the stage $I_{OUT}$ is equal to approximately 20 times the current $I_1$.

Said known output amplifier stage is affected by numerous disadvantages. In particular the current gain of the stage is not constant and passes from $\beta 0.20$ for low output currents to $\beta^2$ for output currents for which the drop on the resistors $R_9$ and $R_{10}$ becomes no longer negligible, practically nullifying the action of the mirror transistors of the final stages. This fact causes a non-linearity in the response of the stage around the quiescent point.

A further cause of non-linearity of this stage is due to the low current which flows, in the quiescent state, in the driving transistors $Q_4$ and $Q_5$ and which must load, during the switching between $Q_6$ and $Q_7$, the capacitance of the base-emitter junction of said output transistors. This capacitance also has difficulties to discharge when the output transistor switches off because the junction between the base and the emitter thereof is inversely biased.

Said known stage furthermore allows reduced dynamics of the output final stage (with drop-out equal to twice the base-emitter drop of the output transistors plus twice the emitter-collector saturation voltage of the driving transistor). The circuit furthermore has a not high stability due to the loops formed by $Q_5$, $Q_7$ and by $Q_4$, $Q_6$, which have a high open-loop gain but unitary closed-loop gain.

Different solutions are conceivable for the solution of the above described problems, but such solutions allow to solve only some of these problems, without however solving them completely and simultaneously or have further circuital or operating disadvantages.

SUMMARY OF THE INVENTION

Accordingly, the aim of the present invention is to provide an integratable class AB output stage for low-frequency amplifiers, in which it is possible to control the output quiescent current of the stage so that it remains approximately constant as the operating conditions of said stage vary.

Within this aim, a particular object of the present invention is to provide an output stage capable of ensuring high dynamics of the output signal.

Yet another object of the present invention is to provide an output stage having high stability.

Not least object of the present invention is to provide an output stage having a simple circuital structure, employing easily integratable elements with small bulk, so as to have low final costs.

This aim, the objects mentioned and others which will become apparent hereinafter are achieved by an integratable class AB output stage for low-frequency amplifiers, as defined in the accompanying claims.

BRIEF DESCRIPTION OF THE DRAWINGS

The features and advantages of the invention will become apparent from the description of some preferred but not exclusive embodiments, illustrated only by way of non-limitative example in the accompanying drawings, wherein.

DESCRIPTION OF THE PREFERRED EMBODIMENTS

Hereinafter FIG. 1, for which reference is made to what has been described above, will not be described.

Figure 2:
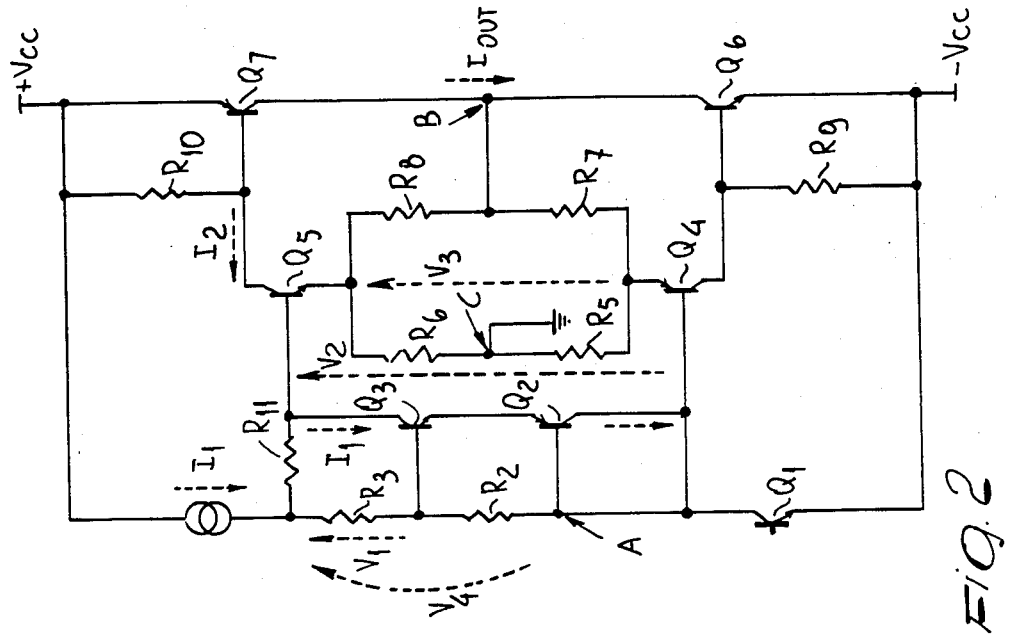
FIG. 2 is a general circuit diagram of the output stage according to the invention.
Figure 1:
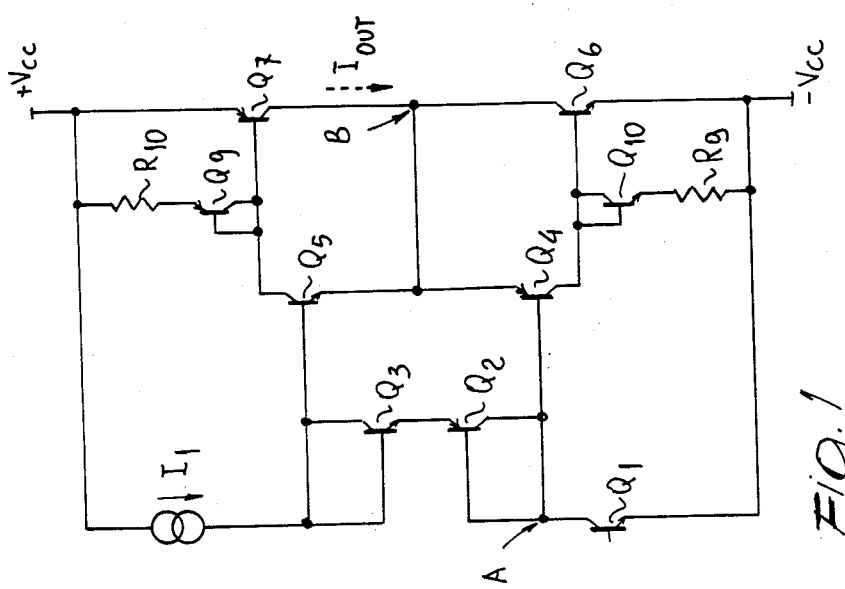
FIG. 1 is a general circuit diagram of a known output stage.

Reference should initially be made to FIG. 2, wherein the elements in common with the known solution, illustrated in FIG. 1, have been given the same reference numerals. In detail, the output stage according to the invention also comprises an input transistor $Q_1$, a driving stage including the transistors $Q_2$–$Q_5$ and the current source $I_1$, and the final power output transistors $Q_6$ and $Q_7$ connected between power supply lines $V_{CC}$ and $-V_{CC}$. Also in this case, the output transistors are connected to the positive and negative power supply with their emitters, and to one another and to the output (identified by point B) with their collector.

In the circuit of FIG. 2, between the base and the emitter of the output transistors $Q_6$ and $Q_7$ the resistors $R_9$ and $R_{10}$ have been inserted to increase the output current gain, but with respect to the known circuit the diodes $Q_8$ and $Q_{10}$ have been eliminated.

According to the invention, the driving circuit comprises a series of resistive elements having the purpose of supplying the base-emitter junctions of the output transistors $Q_6$ and $Q_7$ with voltages proportional to the base-emitter drop of the driving transistors $Q_2$–$Q_5$, setting thereby the output current.

In detail, according to the invention, a first resistor $R_2$ is provided between the bases of the driving transistors $Q_2$ and $Q_3$, while a second resistor $R_3$ is provided between the base of the transistor $Q_3$ and the current source $I_1$. A third resistor $R_{11}$ is provided between the current source $I_1$ and the collector of $Q_3$ and, therefore, the base of $Q_5$. Furthermore, according to the invention, a resistive network is connected in series between the driving transistors $Q_4$ and $Q_5$. Said resistive network comprises a first branch formed by the series-connection of the resistors $R_5$ and $R_6$ and a second branch, formed by $R_7$ and $R_8$. The intermediate point between $R_5$ and $R_6$, indicated in the drawing at C, is connected to the ground, while the intermediate point between $R_7$ and $R_8$ is connected to the output B.

For the understanding of the operation of the circuit according to the invention illustrated in FIG. 2, the following hypotheses, valid as first approximation, are initially made:

$$I_{CQ7}=I_{CQ6}=I_{OUT}$$

$$V_{BEQ6}=V_{BEQ7}=V'_{BE}$$

$$I_{CQ3}=I_{CQ2}=I_1$$

(ignoring the current flowing in the resistors $R_2$, $R_3$)
The resistors $R_6$, $R_8$, $R_5$, $R_7$ are such that the relation $$I_{CQ5}=I_{CQ4}=I_2=I_1$$

is valid.
(it will be seen hereinafter how it is possible to make the following conclusions valid even as the current $I_1$ varies, i.e. when the equality between the current $I_2$ and the current $I_1$ is no longer verified)

$$V_{BEQ2} = V_{BEQ3} = V_{BEQ4} = V_{BEQ5} = V_{BE} \quad (I)$$

$$V_B = V_C = 0V$$

$$\frac{\Delta V_{BE}}{\Delta T} = \frac{\Delta V'_{BE}}{\Delta T}$$

The base currents are negligible and, for the time being, so is the voltage drop on the resistor $R_{11}$ $$R_{10}=R_9=R_4; R_6=R_5; R_8=R_7$$

and let $$R_P=(R_6+R_5)//(R_8+R_7)$$

be the overall resistance of the resistive network interposed between the transistors $Q_5$ and $Q_4$.

Assuming these hypotheses, the follwoing relations are valid:

$$V_2 \simeq V_4 = V_{BEQ2} + V_{BEQ3} + V_1 =$$

$$V_{BEQ2} + V_{BEQ3} + (V_{BEQ2} + V_{BEQ3})\frac{R_3}{R_2} = 2V_{BE}\left(1 + \frac{R_3}{R_2}\right)$$

$$V_3 = V_2 - 2V_{BE} = 2V_{BE}\frac{R_3}{R_2}$$

from which the following results:

$$V'_{BE} = \frac{V_3}{R_P} \cdot R_4 = 2V_{BE}\frac{R_3}{R_2} \cdot \frac{R_4}{R_P}$$

Accordingly, voltages proportional to the base-emitter drop of the transistors of the driving circuit are present on the base-emitter junctions of the final transistors $Q_6$ and $Q_7$, fixing thereby also the output current which is also constant in temperature, since relation (I) has been assumed to hold.

The above is no longer true if the current $I_2$ circulating in the transistors $Q_4$ and $Q_5$ is no longer equal to the current set by the current source $I_1$. In particular $I_1 \neq I_2$ if the current set by the current source $I_1$ is not constant or if it is desired to keep the output current constant as the temperature varies. In this last case, in fact, it is necessary to conveniently vary the base-emitter drop of the final transistors and therefore the voltage on the resistors connected in parallel thereto and thus the current $I_2$ flowing through the transistors $Q_4$ and $Q_5$.

However, with an appropriate choice of the values of the components of the circuit, the output current may be maintained, as first approximation, still constant, regardless of the current of the source $I_1$ or of the temperature variation.

In particular an adequate dimensioning of the resistor $R_1$ is capable of solving the problem caused by any variations of the current $I_1$ set by the current source. In fact, in order that the output current does not vary upon the variation of $I_1$, it is sufficient to cause the voltage $V_2$ existing between the bases of the transistors $Q_4$ and $Q_5$ to remain constant as $I_1$ varies, that is to impose the following relation:

$$\frac{\Delta V_2}{\Delta I_1} = 0$$

This equation is verified if $R_{11}$ is dimensioned as to absorb, in first approximation, the variation of the voltage $V_4$, that is if the variation of the current $I_1$ causes a variation in the voltage $V_4$ equal to the voltage variation existing across the resistor $R_{11}$, thus keeping the voltage $V_2$ constant. In practice the relation $$\frac{\Delta V_4}{\Delta I_1} = \frac{2V_{BE}}{\Delta I_1}\left(1 + \frac{R_3}{R_2}\right) = \Delta I_1 \cdot R_{11}$$

must hold.
Since $$\frac{\Delta V_{BE}}{\Delta I_1} = V_T \ln\left(1 + \frac{\Delta I_1}{I_1}\right)$$

for small percentage variations of the current $I_1$, for which the relation $\Delta I_1 < I_1$ is valid, by developing in series the logarithm function and considering only the first-order term the following equation is obtained $$\frac{\Delta V_{BE}}{\Delta I_1} = V_T \cdot \frac{\Delta I_1}{I_1}$$

from which $$R_{11} = \frac{2V_T(R_2 + R_3)}{I_1 \cdot R_2} \qquad (II)$$

In this manner, in a neighbourhood of the nominal value of $I_1$ the voltage $V_2$, and therefore the output current, do not vary.

Instead, to keep constant the output current not withstanding the variations of the current $I_2$ with temperature (for which therefore $I_1 \neq I_2$), the circuit must be dimensioned as explained hereinafter. On the subject the following quantities are defined:

$$\frac{\Delta V'_2}{\Delta T}$$

is the variation with temperature of the voltage $V_2$ caused by the variation of the drop between base and emitter of the transistors $Q_2$ and $Q_3$ $$\frac{\Delta V''_2}{\Delta T}$$

is the variation with temperature of the same voltage for which the output current is kept constant regardless of the voltage and current variations of the transistors $Q_4$–$Q_6$ as the temperature varies.

In particular the following relations hold:

$$\frac{\Delta V'_2}{\Delta T} = 2\frac{\Delta V_{BE}}{\Delta T}\left(1 + \frac{R_3}{R_1}\right) \qquad (III)$$

and $$\frac{\Delta V''_2}{\Delta T} = 2\frac{\Delta V_{BE}}{\Delta T} + \frac{\Delta V_3}{\Delta T} + 2\frac{\Delta V_{BE}}{\Delta I_2} \cdot \frac{\Delta I_2}{\Delta T} \qquad (IV)$$

where the variation of the voltage $V_2$ which keeps constant the output current is the sum of three terms, the first term whereof is due to the variation of the base-emitter drop of the transistors $Q_4$, $Q_5$, the second term is due to the variation of the base-emitter drop of the output transistors $Q_6$, $Q_7$ and the last term is due to the variation of the base-emitter voltage of the transistors $Q_4$ and $Q_5$ due to the variation of the current $I_2$.

Considering the output current constant, the three terms of equation (IV) are given by $$\frac{\Delta I_2}{\Delta T} = \frac{\Delta V_{BE}}{\Delta T} \cdot \frac{1}{R_A} \qquad (V)$$

$$\frac{\Delta V_3}{\Delta T} = \frac{\Delta V_{BE}}{\Delta T} \cdot \frac{R_P}{R_A} \qquad (VI)$$

$$2\frac{\Delta V_{BE}}{\Delta I_2} \cdot \frac{\Delta I_2}{\Delta T} = 2V_T \ln\left(1 + \frac{\Delta I_2}{\Delta T \cdot I_2}\right) =$$

since, in the temperature interval of operation of an electronic device, the variation of the current $I_2$ is smaller than the absolute value of the current $I_2$ itself, by developing in series the logarithm function it results $$= 2V_T \frac{\Delta I_2}{\Delta T \cdot I_2} = 2V_T \frac{\Delta V_{BE}}{\Delta T} \cdot \frac{1}{R_A \cdot I_2} \qquad (VII)$$

In order that the output current be constant as the temperature varies, let's impose that the variation of the voltage $V_2$ between the bases of $Q_4$ and $Q_5$, due to the first part of the circuit (transistors $Q_2$ and $Q_3$) is equal to the variation of said voltage necessary to keep the current constant, that is:

$$\frac{\Delta V'_2}{\Delta T} = \frac{\Delta V''_2}{\Delta T}$$

Substituting therefore equations (III) and (IV) in the preceding equation, and combining with equations (V)–(VII), it results $$\frac{R_3}{R_2} = \frac{R_P}{2R_A} + \frac{V_T}{R_A \cdot I_2} \qquad (VIII)$$

Accordingly, by conveniently choosing the value of the resistors $R_2$, $R_3$, $R_5$–$R_{10}$ so as to satisfy equation (VIII), it is possible to keep constant the output current of the stage as the temperature varies.

By appropriately choosing the emitter area ratios of the transistors $Q_3$ and $Q_5$, $Q_2$ and $Q_6$ it is possible to simultaneously verify equation (II) and therefore allow a correct operation of the circuit even when the hypothesis of equality between the current delivered by the source and the current flowing in the driving transistors $Q_4$ and $Q_5$ is no longer true.

It should be noted that the circuit for the control of the quiescent or bias current, according to the invention, being largely independent from the absolute value of the resistors employed, but depending only on ratios therebetween, is easily executable in an integrated circuit.

The illustrated circuit has high output signal dynamics, limited only by the collector-emitter saturation voltages of the transistors $Q_6$ and $Q_7$. This high dynamics is due to the gain between point A and the output B, which is approximately equal to $$G = \frac{V_B}{V_A} \simeq 1 + \frac{R_8}{R_6} = 1 + \frac{R_7}{R_5}$$

In particular said gain must have such a value that the first transistors to saturate are the final output transistors $Q_6$ and $Q_7$.

As a consequence of the indicated obtainable gain, this stage is capable of operating with phase and gain margins of the stages formed by $Q_5$, $Q_7$, with their feedback resistors $R_8$, $R_6$ and by $Q_4$, $Q_6$ with the resistors $R_7$, $R_5$ much higher than those obtainable by known circuits similar to the one illustrated in FIG. 1 which has a unitary voltage gain between input and output. In this manner a greater stability of the system is achieved and, if applied in audio amplifiers, it allows the elimination of the R-C cell normally placed between the output and the ground.

Figure 3:
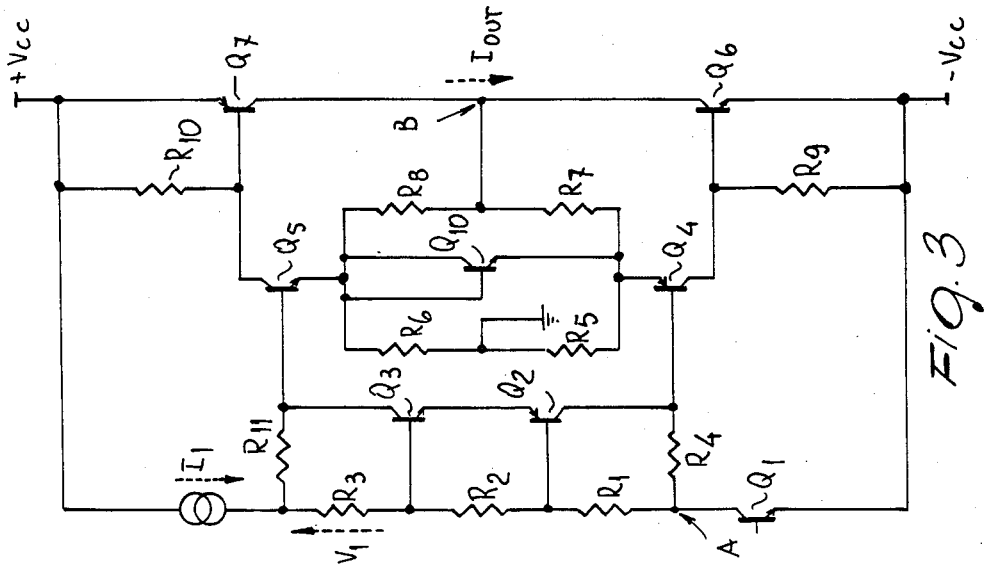
FIG. 3 illustrates a different embodiment of the output stage according to the invention.

FIG. 3 illustrates a different embodiment of the circuit of FIG. 2. More precisely, the circuit of FIG. 3 is substantially constituted by the one of FIG. 2, but with respect thereto further components have been provided. In particular a resistor $R_1$ has been provided between the base of the transistor $Q_2$ and the input A, a resistor $R_4$ has been arranged between the input A and the base of the transistor $Q_4$ (and therefore the collector of $Q_2$) and a diode-connected transistor $Q_8$ has been inserted in parallel; to the resistive network $R_5$-$R_8$.

In detail, the resistor $R_1$ may be useful to account, in current of $Q_2$ and therefore the current gain of PNP transistors. In fact, due to the insertion of $R_1$, the voltage $V_2$ is greater than the previously calculated one, a current $I_2$ greater than the calculated one being thus obtained which therefore compensates the base current absorbed by $Q_6$ and subtracted from the current supplied to the resistor $R_9$.

The function of the resistor $R_4$ is to optimize the symmetry of the system.

Finally, the diode $Q_8$ increases the maximum current deliverable by the driving transistors $Q_5$ and $Q_4$, and therefore the base current in the output transistors.

In fact, without the diode-transistor $Q_8$, the maximum deliverable current would be:

$$I_{Q5MAX} \simeq \frac{V_{CC} - V_{BEQ7} - V_{CEQ5, sat}}{R_6}$$

$$I_{Q4MAX} \simeq \frac{V_{CC} - V_{BEQ6} - V_{CEQ4, sat}}{R_5}$$

(Ignoring the current flowing through the resistors $R_8$ and $R_7$ which in this operating stage have a very small drop).

Instead, by virtue of the insertion of $Q_8$, the following equations are valid:

$$I'_{Q5MAX} \simeq I_{Q5MAX} + \frac{V_{CC} - V_{BEQ7} - V_{CEQ5, sat} - V_{BEQ8}}{R_5}$$

$$I'_{Q4MAX} \simeq I_{Q4MAX} + \frac{V_{CC} - V_{BEQ6} - V_{CEQ4, sat} - V_{BEQ8}}{R_6}$$

In practice the diode $Q_8$ is capable of providing a further path between $Q_5$ or $Q_4$ towards the ground, through the resistors $R_5$ or $R_6$.

Figure 4:
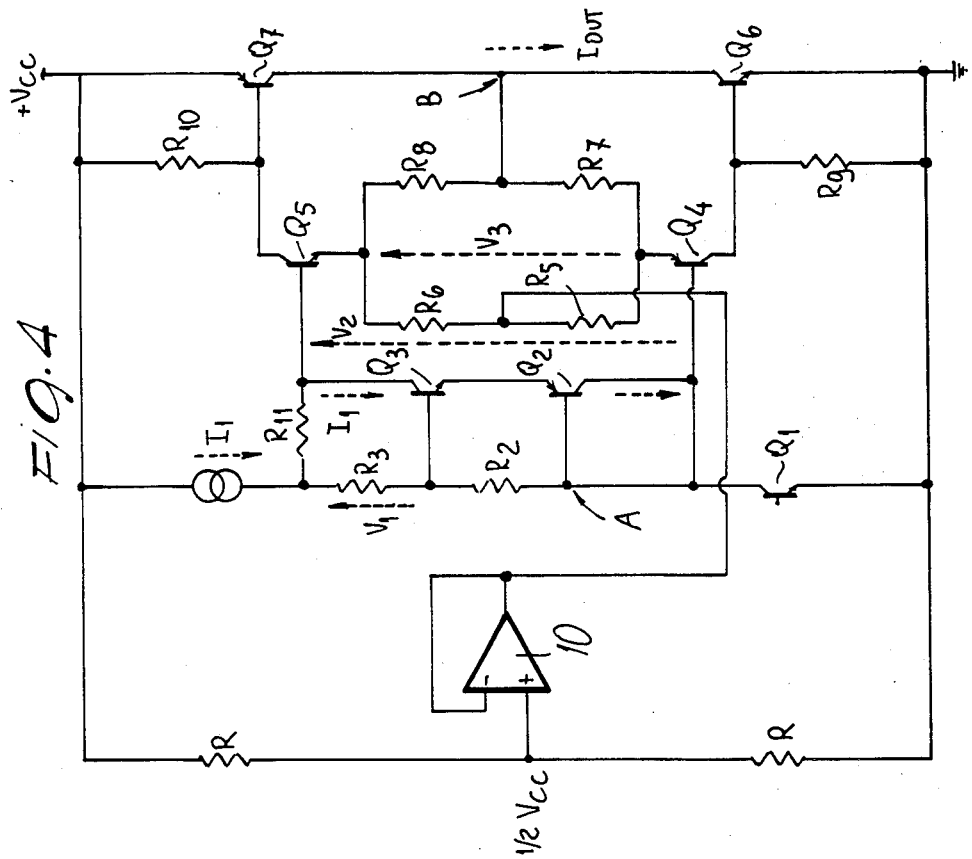
FIG. 4 illustrates a further embodiment of the output stage according to the invention.

In FIG. 4 a further embodiment of the invention is illustrated, wherein the circuit employs a single power supply, instead of using a double power supply as in the solutions of FIGS. 2 and 3.

The circuit of FIG. 4 substantially corresponds to the one of FIG. 2, with the exception that the lower reference voltage line $-V_{CC}$ has been replaced with the ground and the intermediate point between the resistors $R_5$ and $R_6$ is no longer connected to the ground but is connected to the output of an auxiliary operational amplifier 10 having the positive terminal set to a voltage $V_{CC}/2$ (by virtue of the insertion of two resistors with equal value between said positive terminal on the one side and the positive power supply $V_{CC}$ and the ground, respectively on the other side) and connected as a voltage follower. Said auxiliary amplifier 10 must be capable of supplying (or absorbing) a maximum current equal to the maximum base current of the final transistors $Q_6$ and $Q_7$ (previously calculated and indicated at $I_{Q5MAX}$ and $I_{Q4MAX}$).

As is apparent from the previous description, the invention fully achieves the intended aim and objects. An output amplifier stage has in fact been provided capable of keeping constant the output current regardless of the operating state of said amplifier and regardless of the operating temperature. Furthermore, the circuit is extremely simple (it requires only the integration of appropriate resistors), is reliable (in particular, as explained, it has high stability) and can be used both in the case of double power supply and in the case of simple power supply.

The invention thus conceived is susceptible to numerous modifications and variations, all within the scope of the inventive concept. In particular the fact is stressed that the resistor $R_{11}$, convenient for compensating in first approximation the variation of the current delivered by the source $I_1$, may be omitted, if a constant-current is available, and the circuit may be integrated or not with further components capable of compensating second-order effects or of improving the symmetry.

Furthermore, all the details may be replaced with other technically equivalent ones.

I claim:

1. An integratable class AB output stage for low-frequency amplifiers, comprising
    an input transistor;
    a driving circuit comprising a current source, first and second driving transistors, mutually connected in series and having opposite terminals connected respectively to said driving current source and to said input transistor, third and fourth driving transistors, mutually connected in series, and having each a base terminal connected to a respective one of said opposite terminals, said third and fourth driving transistors defining first and second driving output terminals; and
    first and second output transistors, connected in series between a pair of reference voltage lines and having an intermediate common point defining a stage output terminal,
    said driving circuit further comprising a first resistor connected between said current source and a base terminal of said first driving transistor, a second resistor connected between said base terminal of said first driving transistor and a base teminal of said second driving transistor, and a resistive network connected in series between said third and said fourth driving transistors, said resistive network comprising at least first and second resistive branches mutually connected in parallel, each branch defining an intermediate terminal, the intermediate terminal of said first resistive branch being connected to a further reference voltage line, intermediate between said pair of reference voltage lines, and the intermediate terminal of said second branch being connected to said stage output terminal.

2. An output stage according to claim 1, wherein said resistive branches comprise each a third and a fourth resistors, said third resistors of said two resistive branches having mutually equal resistance value and said fourth resistors of said two resistive branches having mutually equal resistance value.

3. An output stage according to claim 1, wherein said driving circuit comprises a further resistor interposed between the base terminal of said third driving transistor and said current source.

4. An output stage according to claim 1, further comprising a resistive element interposed between said second resistor and said input transistor.

5. An output stage according to claim 1, further comprising a further resistive element interposed between said input transistor and the base terminal of said fourth driving transistor.

6. An output stage according to claim 1, further comprising a one-way switch element connected in parallel to said resistive network.

7. An output stage according to claim 1, further comprising a diode connected in parallel to said resistive network and having an anode connected to said third driving transistor and a cathode connected to said fourth driving transistor.

8. An output stage according to claim 1, wherein said pair of reference voltage lines respectively feed a positive and a negative supply voltages and said further reference voltage line is connected to ground.

9. An output stage according to claim 1, wherein said reference voltage lines of said pair are respectively connected to a positive supply voltage and to a ground and said further reference voltage line is connected to a voltage equal to half of said positive supply voltage.

10. An output stage according to claim 1, further comprising an operational amplifier circuit connected as a voltage-follower, having a positive input terminal connected to said pair of reference lines through equal resistive elements and a negative input terminal connected to an operational amplifier output terminal and to said intermediate terminal of said first resistive branch.

* * * * *